United States Patent [19]

Shoji

[11] Patent Number: 5,578,952
[45] Date of Patent: Nov. 26, 1996

[54] FIXED-INTERVAL TIMING CIRCUIT AND METHOD

[75] Inventor: Masakazu Shoji, Warren, N.J.

[73] Assignee: Lucent Technologies Inc., Murray Hill, N.J.

[21] Appl. No.: 335,616

[22] Filed: Nov. 8, 1994

[51] Int. Cl.$^6$ .................................................... H03K 9/08
[52] U.S. Cl. .................................. 327/172; 327/227
[58] Field of Search .............................. 327/172, 173, 327/174, 175, 227, 228, 229, 230, 113, 102, 394, 398, 399, 263, 264, 132, 114, 182, 164, 176

[56] References Cited

U.S. PATENT DOCUMENTS 5,331,208  7/1994  Meyer ............................ 327/172
5,379,321  1/1995  Girmay ........................... 327/172

Primary Examiner—Timothy P. Callahan
Assistant Examiner—Eunja Shin
Attorney, Agent, or Firm—Brian K. Dinicola

[57] ABSTRACT

A system and method for generating a signal having a reliable, fixed duration and/or delay as a function of relative, not absolute, device characteristics. That is to say, the time period of the generated signal is determined as a ratio of one device's operating characteristics to another device's operating characteristics. In particular, the invention provides a fixed time signal as a function of the relative values of two capacitive elements that have a known ratio of capacitance with respect to each other. The invention is particularly useful when implemented upon an integrated circuit, as standard fabrication techniques for such circuits allow relative device characteristics to be held to relatively tight tolerances.

14 Claims, 2 Drawing Sheets

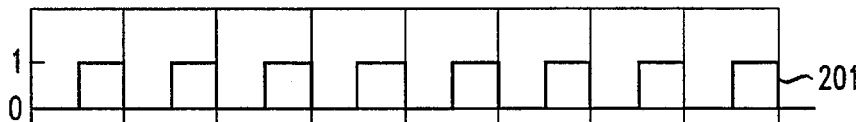
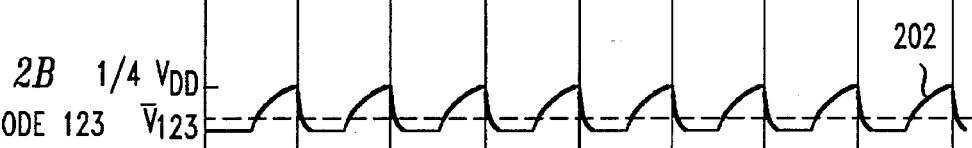
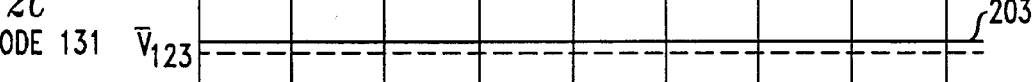
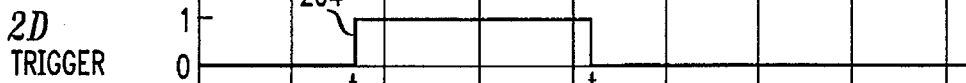
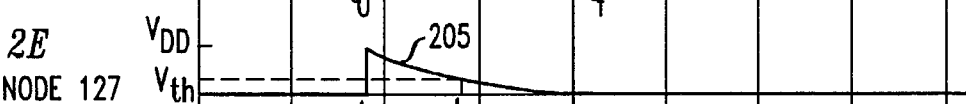
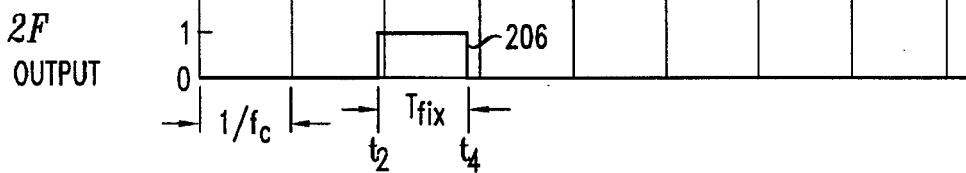
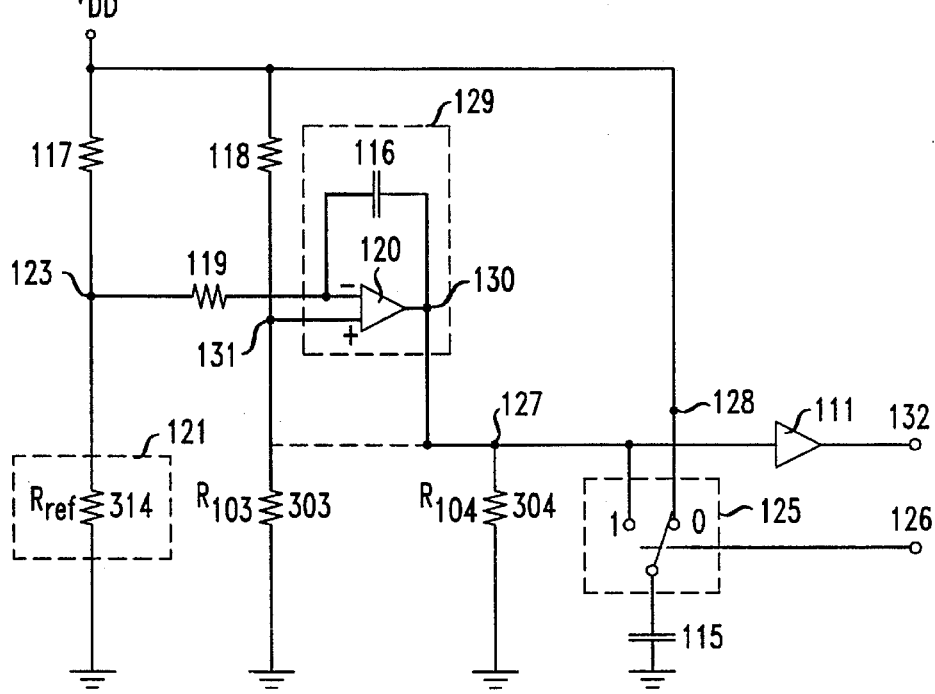

FIXED-INTERVAL TIMING CIRCUIT AND METHOD

TECHNICAL FIELD

The invention relates to timing circuits, and in particular, to an arrangement for defining a fixed interval.

BACKGROUND OF THE INVENTION

Almost invariably, the operation of digital electronic circuitry requires the availability or generation of a pulse or delay having a reliable and consistent duration. Individual devices, especially those fabricated upon high-density integrated circuits cannot usually be relied upon to provide accurate or consistent time delays or clock functions. This is because, barring the use of prohibitively expensive methods (such as trimming), fabrication process tolerances cannot be tightly controlled for the batch-production environments in which such circuits are typically manufactured. For example, in the mass-production of semiconductor integrated circuits it is not uncommon for absolute individual device characteristics, such as the particular channel resistance within a field-effect transistor ("FET") or a given device capacitance level, to vary by as much as 100 percent from wafer to wafer. It is this wide variation in device characteristics that renders individual passive or active devices upon an integrated circuit impractical and unreliable for purposes of providing predictable timing intervals—especially in high-speed computing applications where accurate timing and precise circuit delay times are critical.

SUMMARY OF THE INVENTION

The aforementioned problems are solved, in accordance with the principles of the invention, by providing a system and method for generating a signal having a reliable, fixed duration and/or delay as a function of relative, not absolute, device characteristics. That is to say, the time period of the generated signal is determined as a ratio of one device's operating characteristics to another device's operating characteristics. In particular, the invention provides a fixed time signal or delay as a function of the relative values of two capacitive elements that have a known ratio of capacitance with respect to each other. The invention is particularly useful when implemented upon an integrated circuit, as standard fabrication techniques for such circuits allow relative device characteristics to be held to relatively tight tolerances.

BRIEF DESCRIPTION OF THE DRAWING

In the drawing:

FIG. 2A–2F provides an illustration of various signal waveforms that occur within the circuit of FIG. 1; and FIG. 3 shows a schematic illustration of a simplified equivalent circuit for the timing circuit of FIG. 1.

DETAILED DESCRIPTION

Figure 1:
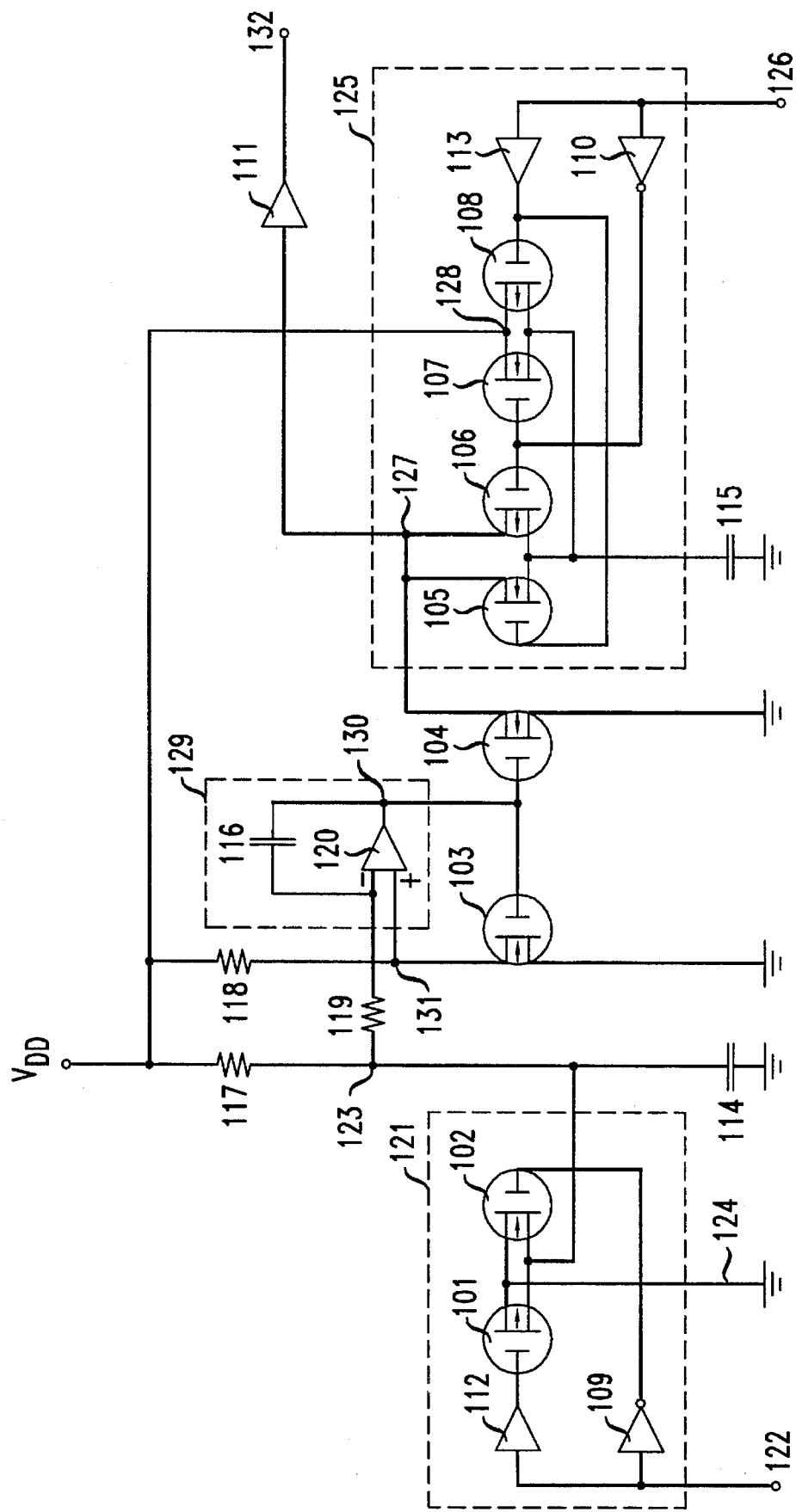
FIG. 1 shows a schematic illustration of a timing circuit incorporating an embodiment of the invention.

FIG. 1 is an illustration providing a schematic diagram of a timing circuit incorporating an embodiment of the invention. The circuit is fabricated upon a single integrated circuit and includes FETs 101–108, inverters 109–110, buffers 111–113, reference capacitor 114, delay capacitor 115, feedback capacitor 116, resistors 117–119, and operational amplifier 120. FETs 103 and 104 are a matched pair (i.e., they are fabricated to exhibit practically identical electrical characteristics). Likewise, resistors 117 and 118 are also fabricated to be a matched pair. Ideally, to minimize switching noise, FETs 101 and 102 should have identical channel dimensions. Similarly, the size of the channels in FETs 105–108 should also be matched.

FETs 101 and 102, along with inverter 109 and buffer 112 (a collection of components herein after referred to as FET switch 121) are configured to effectively operate as a single-pole, single-throw switch that, in response to a reference clock signal applied to terminal 122, alternately connects and disconnects one terminal of reference capacitor 114 and circuit node 123 to ground terminal 124. When the reference clock signal is in a low state (referred to as a logical 0 state) FET switch 121 provides a conductive path between reference capacitor 114 and ground terminal 124. Similarly, FETs 105, 106, 107 and 108, along with inverter 110 and buffer 113 (collectively referred to as FET switch 125) are configured to effectively operate as a single-pole, double-throw switch that, in response to a trigger signal applied to terminal 126 alternately connects one terminal of delay capacitor 115 to either circuit node 127 or circuit node 128. When the reference clock signal is in high state (referred to as logical 1 state) a conductive path between delay capacitor 115 and node 127 is created, and when the reference clock signal is in logical 0 state a conductive path between reference capacitor 114 and node 128 is created.

The circuitry illustrated in FIG. 1 operates as follows. A reference clock signal, having a frequency $f_c$, is provided to terminal 122 from a stable source such as quartz crystal or other electronic oscillator having a 50% duty cycle. For electrical signals having a frequency much less than $f_c$, reference capacitor 114 will appear as a fixed resistance of value $R_{ref}$, where $R_{ref}=1/(8C_{ref}f_c)$, and $C_{ref}$ is the capacitance of reference capacitor 114. Unfortunately, because absolute component values cannot be held to very tight tolerances upon the typical integrated circuit, and because the value of $1/(8C_{ref}f_c)$ is only valid for signals having a frequency much less than $f_c$ or electrical transients having a time scale much longer than $1/f_c$, the particular resistance value apparent across reference capacitor 114 cannot be directly relied upon to provide a basis for the generation of a fixed time signal or delay. Instead, the circuit of FIG. 1 provides a fixed duration pulse or delay as a function of the ratio of the value of reference capacitor 114 ($C_{ref}$) and delay capacitor 115 ($C_{delay}$)—While typical integrated circuit fabrication methods make precise control of absolute device values difficult, the relative device values upon the wafer can be accurately maintained.

The voltage evident at node 123 has the same frequency as the reference clock signal. This time dependent signal is time-averaged over a period much longer than $1/f_c$ by low-pass comparator 129 (comprising input resistor 119, feedback capacitor 116, and operational amplifier 120). The output of low-pass comparator 129 is evident at node 130 and serves to bias the gates of FETS 103 and 104. When the voltage evident at node 123 is greater than the voltage evident at node 131 the output of low-pass comparator 129 is reduced. This reduced voltage is applied to the gate of FET 103, and results in an increase of the effective channel resistance of FET 103. Consequently, the voltage evident at node 131 is increased. Conversely, when the voltage evident at node 123 is less than the voltage evident at node 131, the output of low-pass comparator 129 is increased, thereby lowering the effective channel resistance of FET 103, and causing the voltage at node 131 to decrease. The voltage at node 123 is given by:

$$V_{123} = V_{DD} \left( \frac{R_{ref}}{R_{117} + R_{ref}} \right).$$

Similarly, the voltage evident at node 131, $V_{131}$, is a function of the relative values of the FET 103's effective channel resistance, $R_{103}$, and resistor 118, $R_{118}$. This voltage, $V_{131}$ will be equal to:

$$V_{131} = V_{DD} \left( \frac{R_{103}}{R_{118} + R_{103}} \right).$$

Through the operation of low-pass comparator 129 the voltage applied to the gate of FET 103 will be adjusted until an equalized state where $R_{ref}=R_{103}$ and $\overline{V}_{123}=V_{131}$ is attained (where $\overline{V}_{123}$ is the time averaged value of $V_{123}$). Because FET 103 and FET 104 are a matched pair, and both subjected to the same gate voltage, the effective chapel resistance of FET 104, $R_{104}$, will be equalized with that of FET 103 ($R_{103}$), so that:

$$\frac{1}{8C_{ref}f_c} = R_{ref} = R_{103} = R_{104}.$$

Assuming resistor 117 and resistor 118 are each fabricated to have values approximately three times that of $1/(8C_{ref}f_c)$, it follows that when the reference clock signal is in a logical 1 state, the level of $V_{123}$ will rise to a maximum value of approximately $\frac{1}{4}V_{DD}$. As the reference clock signal oscillates, $V_{123}$ rises and falls in accordance with the time constant of the circuit formed by resistor 117 and delay capacitor 114, the voltage evident at node 131 is held to a constant value of $\overline{V}_{123}$. FIG. 2 provides an illustration of various signals that occur within the circuit of FIG. 1 during normal operation, including the reference clock signal (201) and the waveform evident at nodes 123 (202) and 130 (203).

FIG. 3 is a schematic illustration of an equivalent circuit for the timing circuit of FIG. 1. As shown, the combination of FET switch 121 and reference capacitor 114 are represented by resistor 314 (having a value $R_{ref}$). FET switch 125 is represented as a single-pole, double-throw relay controlled by the trigger signal. Matched FETs 103 and 104 are depicted as resistors 303 and 304, respectively (having the values $R_{103}$ and $R_{104}$, where $R_{103}=R_{104}$). The dotted line connecting the output of operational amplifier 120 with resistors 303 and 304 is a representation of the voltage equalization performed by low-pass comparator 129.

To initiate the operation of the circuit illustrated in FIGS. 1 and 3, the trigger signal applied to terminal 126 is brought from a logical 0 state to a logical 1 state (shown to occur at time $t_0$ in FIG. 2). In order to ensure a reliable output by the circuit of FIGS. 1 and 3 the particular instant at which the trigger signal makes the transition need not be synchronized with respect to any transition in signal level by the reference clock, or the signal evident at node 122. Furthermore, the period over which the trigger signal is held in a logical 1 state ($t_f$–$t_0$ as shown by waveform 204 in FIG. 2) is also inconsequential with respect to the generation of fixed time signal or delay by the circuit (except for the obvious limitation that the interval $t_f$–$t_0$ have a longer duration than $T_{fix}$, the signal that will be output by the circuit of FIGS. 1 and 3 at terminal 132).

When the trigger signal is at a logical 0 level, a conductive path between delay capacitor 115 and $V_{DD}$ is established within FET switch 125. When the reference clock signal is brought to a logical 1 level, FET switch 125 provides a conductive path between delay capacitor 115 and node 127, thereby allowing delay capacitor 115 to discharge to ground via FET 104. As shown by waveform 205 in FIG. 2, the voltage at node 127 initially rises from zero to approximately $V_{DD}$ at time $t_1$ in response to the trigger signal being brought to a logical 1 level at $t_0$. The delay from $t_0$ to $t_1$ is a result of the delays introduced by inverter 110 and buffer 113 (FIG. 1). The rise of the voltage at node 127 causes the output of buffer 111 (evident at terminal 132 of FIGS. 1 and 3) to assume a logical 1 level at $t_2$ (see waveform 206 of FIG. 2). The delay from $t_1$ to $t_2$ is a function of the response time of buffer 111.

The voltage at node 127 then decays to zero as delay capacitor 115 discharges through FET 104. The rate of this decay is dictated by the time constant $T_D$, where $T_D=(C_{delay} R_{104})$, and $$V_{127}(t) = V_{DD}(e^{-t/T_D}).$$

Since the value of FET 104's channel resistance, $R_{104}$, is equal to $1/(8C_{ref}f_c)$, it is clear that this voltage decay is a function of the values of the reference and delay capacitors:

$$V_{127}(t) = V_{DD}(e^{-t/T_D})$$

$$V_{127}(t) = V_{DD}(e^{-t/(C_{delay}R_{104})})$$

$$V_{127}(t) = V_{DD}\left(e^{-\left(\frac{8C_{ref}f_ct}{C_{delay}}\right)}\right).$$

At time $t_3$ the voltage level at node 127 falls below the threshold voltage, $V_{th}$, of buffer 111 (the output of buffer 111 is 1 for $V>V_{th}$, and 0 for $V<V_{th}$). As a result, the output of buffer 111 assumes a logical 0 level at time $t_4$ (the delay from $t_3$ to $t_4$ being a function of buffer 111's response time).

The fixed duration, $T_{fix}$, of the signal provided by the circuit illustrated in FIGS. 1 and 3 is the time from $t_2$ to time $t_4$, and can be defined as the time it takes for the voltage at node 127 to decay from $V_{DD}$ to $V_{th}$, and can be represented as:

$$T_{fix} = \left( \frac{C_{delay}}{8C_{ref}f_c} \right) \left( -\ln\left( \frac{V_{th}}{V_{DD}} \right) \right).$$

As $V_{DD}$, $V_{th}$, and $f_c$ are known, fixed values, the only true variable in determining the duration of $T_{fix}$ is $C_{ref}/C_{delay}$. As standard integrated circuit fabrication techniques allow relative device characteristics to be held to tight tolerances, the circuitry of FIG. 1, when implemented upon an integrated circuit, will reliably and accurately provide a signal defining a fixed interval.

The invention illustrated in FIGS. 1 and 3 can also be utilized to provide a fixed delay. The trailing edge of the pulse in waveform 206 (FIG. 2) will always be delayed by exactly $(T_{fix}+K)$ from time $t_0$ (the time at which the trigger signal made the transition from logical 0 to logical 1). K is the total delay introduced by the operation of low-pass comparator 129, buffers 111–113, and inverters 109 and 110. K is a constant for a particular circuit, and can be readily computed (based upon the physical characteristics of the particular devices in the circuit) or measured.

It will be understood that the particular method and embodiment described above are only illustrative of the principles of the present invention, and that various modifications could be made by those skilled in the art without departing from the scope and spirit of the present invention, which is limited only by the claims that follow. One such modification would be employing an inductor, or other reactive circuit element in place of the timing capacitor and/or the reference capacitor.

I claim:

1. A circuit for defining a fixed interval, comprising:

a first capacitor;

a first switch configured to alternately charge and discharge said first capacitor at frequency $f_c$;

means connected to sense the effective resistance of said first capacitor at frequency $f_c$, and responsively bias a transistor so that its effective resistance is maintained at a level substantially equal to that of said sensed effective resistance of said first capacitor;

a second capacitor charged to a first level;

a second switch configured to switchably discharge said second capacitor via said biased transistor; and means for generating a signal having a fixed duration as a function of the rate at which said charge upon said second capacitor discharges through said biased transistor.

2. The invention of claim 1 wherein said transistor is a field-effect transistor.

3. The invention of claim 1 wherein said first and said second switches are each transistor switching arrangements.

4. The invention of claim 1 wherein said circuit is fabricated on a single integrated circuit.

5. A circuit for defining a fixed interval, comprising:

a first capacitor;

a first switch configured to alternately charge and discharge said first capacitor at frequency $f_c$;

means connected to sense the effective resistance of said first capacitor at frequency $f_c$, and responsively bias a transistor so that the resistance of said transistor is maintained at a level substantially equal to that of said sensed effective resistance of said first capacitor;

a second capacitor charged to a first voltage level;

a second switch configured to switchably discharge said second capacitor via said biased transistor;

means for sensing a voltage evident across said second capacitor; and means for providing an indication of the interval over which said sensed voltage decays from said first voltage level to a predetermined second voltage level.

6. The invention of claim 5 wherein said means for providing an indication of the interval over which said sensed voltage decays from said first voltage level to a predetermined second voltage level comprises a buffer that responds to a predetermined threshold voltage.

7. The invention of claim 5 wherein said first and said second switches are each transistor switching arrangements.

8. The invention of claim 5 wherein said biased transistor is a field-effect transistor.

9. The invention of claim 5 wherein said circuit is fabricated on a single integrated circuit.

10. A circuit for defining a fixed interval, comprising:

a first capacitor;

a first switch configured to alternately charge and discharge said first capacitor at frequency $f_c$;

a comparator connected to sense the effective resistance of said first capacitor at frequency $f_c$, and responsively bias a pair of field-effect transistors so that the channel resistance of each of said field-effect transistors is maintained at a level substantially equal to that of said sensed effective resistance of said first capacitor;

a second capacitor charged to a first voltage level;

a second switch configured to switchably discharge said second capacitor via the channel of one of said biased field-effect transistors;

means for sensing a voltage evident across said second capacitor; and means for providing an indication of the interval over which said sensed voltage decays from said first voltage level to a predetermined second voltage level.

11. The invention of claim 10 wherein said means for providing an indication of the interval over which said sensed voltage decays from said first voltage level to a predetermined second voltage level comprises a buffer that responds to a predetermined threshold voltage.

12. The invention of claim 10 wherein said comparator comprises an operational amplifier.

13. The invention of claim 10 wherein said first and said second switches are each transistor switching arrangements.

14. The invention of claim 10 wherein said circuit is fabricated on a single integrated circuit.

* * * * *